United States Patent
Oyama

(10) Patent No.: US 11,251,715 B2
(45) Date of Patent: Feb. 15, 2022

(54) SYNCHRONOUS RECTIFICATION CONTROL CIRCUIT, CONTROL METHOD, POWER SUPPLY SYSTEM, ELECTRONIC APPARATUS, ELECTRIC VEHICLE, AND ELECTRIC POWER SYSTEM

(71) Applicant: SONY CORPORATION, Tokyo (JP)

(72) Inventor: Yoshiki Oyama, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/770,824

(22) PCT Filed: Nov. 6, 2018

(86) PCT No.: PCT/JP2018/041150
§ 371 (c)(1),
(2) Date: Jun. 8, 2020

(87) PCT Pub. No.: WO2019/123868
PCT Pub. Date: Jun. 27, 2019

(65) Prior Publication Data
US 2021/0184587 A1    Jun. 17, 2021

(30) Foreign Application Priority Data
Dec. 20, 2017  (JP) .............................. JP2017-243982

(51) Int. Cl.
*H02M 3/335*  (2006.01)
*G01R 19/165*  (2006.01)
(Continued)

(52) U.S. Cl.
CPC .. *H02M 3/33592* (2013.01); *G01R 19/16538* (2013.01); *H03K 5/24* (2013.01); *H02M 1/0012* (2021.05); *H02M 1/0025* (2021.05)

(58) Field of Classification Search
None
See application file for complete search history.

(56) References Cited

U.S. PATENT DOCUMENTS 5,946,207 A * 8/1999 Schoofs ............ H02M 3/33507
                                                                        363/127
7,777,455 B1 * 8/2010 Martin .................. H02M 3/158
                                                                        320/160
(Continued)

FOREIGN PATENT DOCUMENTS

CN     103795257 A    5/2014
JP     11-341799 A    12/1999
(Continued)

OTHER PUBLICATIONS

International Search Report and Written Opinion of PCT Application No. PCT/JP2018/041150, dated Jan. 8, 2019, 6 pages of ISRWO.

*Primary Examiner* — Jeffrey A Gblende
(74) *Attorney, Agent, or Firm* — Chip Law Group

(57) ABSTRACT

A synchronous rectification control circuit includes a first drive unit that outputs a signal for controlling turning on/off of a synchronous rectification element disposed on a secondary side, a second drive unit that performs control to make a voltage between both ends of the synchronous rectification element equal to a predetermined threshold voltage during a predetermined period during which a rectification current flows on the secondary side, and a drive switching unit that selectively supplies an output from the first drive unit and an output from the second drive unit to the synchronous rectification element.

18 Claims, 7 Drawing Sheets

(51) Int. Cl.
*H03K 5/24* (2006.01)
*H02M 1/00* (2006.01)

(56) References Cited

U.S. PATENT DOCUMENTS

2014/0003096 A1\* 1/2014 Deng ................ H02M 3/33592
　　　　　　　　　　　　　　　　　　　363/21.14
2014/0119061 A1　　5/2014 Chiba et al.
2016/0036339 A1\* 2/2016 Kikuchi ............ H02M 3/33523
　　　　　　　　　　　　　　　　　　　363/21.14

FOREIGN PATENT DOCUMENTS

| JP | 11341799 A | \* | 12/1999 |
| JP | 2009-268325 A | | 11/2009 |
| JP | 2014-090534 A | | 5/2014 |
| JP | 2016-036217 A | | 3/2016 |

\* cited by examiner

FIG. 2
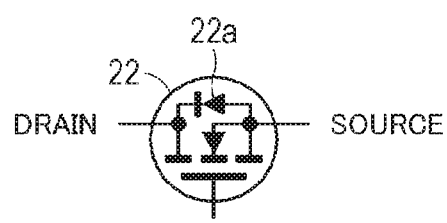
EQUIVALENT CIRCUIT IN ON-STATE
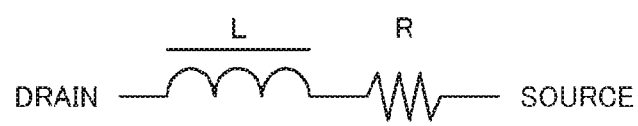

SYNCHRONOUS RECTIFICATION CONTROL CIRCUIT, CONTROL METHOD, POWER SUPPLY SYSTEM, ELECTRONIC APPARATUS, ELECTRIC VEHICLE, AND ELECTRIC POWER SYSTEM

CROSS REFERENCE TO RELATED APPLICATIONS

This application is a U.S. National Phase of International Patent Application No. PCT/JP2018/041150 filed on Nov. 6, 2018, which claims priority benefit of Japanese Patent Application No. JP 2017-243982 filed in the Japan Patent Office on Dec. 20, 2017. Each of the above-referenced applications is hereby incorporated herein by reference in its entirety.

TECHNICAL FIELD

The present disclosure relates to a synchronous rectification control circuit, a control method, a power supply system, an electronic apparatus, an electric vehicle, and an electric power system.

BACKGROUND ART

There has been a suggested technology relating to a synchronous rectification control circuit (see Patent Document 1 mentioned below, for example). A synchronous rectification control circuit is a circuit that uses a transistor such as a metal oxide semiconductor field effect transistor (MOSFET) as a rectification element, instead of a diode, and actively turns on/off (conducts/blocks) the transistor in synchronization with the periods during which a rectification current flows. By doing so, the circuit aims to make conduction loss smaller than that in a case where rectification is performed with a diode, and reduce loss to be caused by the rectification element.

CITATION LIST

Patent Document

Patent Document 1: Japanese Patent Application Laid-Open No. 2016-36217

SUMMARY OF THE INVENTION

Problems to be Solved by the Invention

In such a field, loss to be generated in a synchronous rectification control circuit is expected to be minimized to increase efficiency.

Therefore, an object of the present disclosure is to provide a synchronous rectification control circuit capable of minimizing loss, a control method that can be implemented in the synchronous rectification control circuit, a power supply system in which the synchronous rectification control circuit is used, an electronic apparatus, an electric vehicle, and an electric power system.

Solutions to Problems

The present disclosure is a synchronous rectification control circuit that includes:

a first drive unit that outputs a signal for controlling turning on/off of a synchronous rectification element disposed on a secondary side;

a second drive unit that performs control to make a voltage between both ends of the synchronous rectification element equal to a predetermined threshold voltage during a predetermined period during which a rectification current flows on the secondary side; and a drive switching unit that selectively supplies an output from the first drive unit and an output from the second drive unit to the synchronous rectification element, for example.

The present disclosure is a control method that is implemented in a synchronous rectification control circuit, and includes:

outputting a signal for controlling turning on/off of a synchronous rectification element disposed on a secondary side, a first drive unit performing the outputting; performing control to make a voltage between both ends of the synchronous rectification element equal to a predetermined threshold voltage during a predetermined period during which a rectification current flows on the secondary side, a second drive unit performing the control; and selectively supplying an output from the first drive unit and an output from the second drive unit to the synchronous rectification element, a drive switching unit performing the selective supplying, for example.

The present disclosure is a power supply system that has an input power supply connected to a primary side, and a load connected to a secondary side, and includes the synchronous rectification circuit described above, which controls a synchronous rectification element disposed on the secondary side, for example.

The present disclosure may be an electronic apparatus that receives an electric power supply from the power supply system described above.

The present disclosure may be an electric vehicle that includes: a conversion device that receives a supply of electric power from the power supply system described above, and converts the electric power into vehicle drive power; and a control device that performs information processing related to vehicle control on the basis of information about the power supply system.

The present disclosure may be an electric power system that includes a power information transmission/reception unit that transmits and receives a signal to and from another device via a network, and performs charge/discharge control on the power supply system described above, on the basis of information received by the power information transmission/reception unit.

The present disclosure may be an electric power system that receives a supply of electric power from the power supply system described above, or supplies electric power to the power supply system from a power generating unit or a power network.

Effects of the Invention

According to at least one embodiment of the present disclosure, loss in a synchronous rectification control circuit can be reduced as much as possible. Note that the effects of the present technology are not limited to the effects described herein, and may include any of the effects described in the present disclosure. Further, the contents of the present disclosure should not be interpreted in a restrictive manner on the basis of the effects described as example effects herein.

BRIEF DESCRIPTION OF DRAWINGS

FIG. 2 is a diagram for explaining an equivalent circuit of a state in which a MOSFET is completely in an on-state.

MODE FOR CARRYING OUT THE INVENTION

The following is a description of an embodiment and the like of the present disclosure, with reference to the drawings. Note that explanation will be made in the following order.
<General explanation of the technology>
<1. Embodiment>
<2. Modifications>
<3. Example Applications>

The embodiment and the like described below are preferred specific examples of the present disclosure, and the contents of the present disclosure are not limited to the embodiment and the like.

<General Explanation of the Technology>

Figure 1:
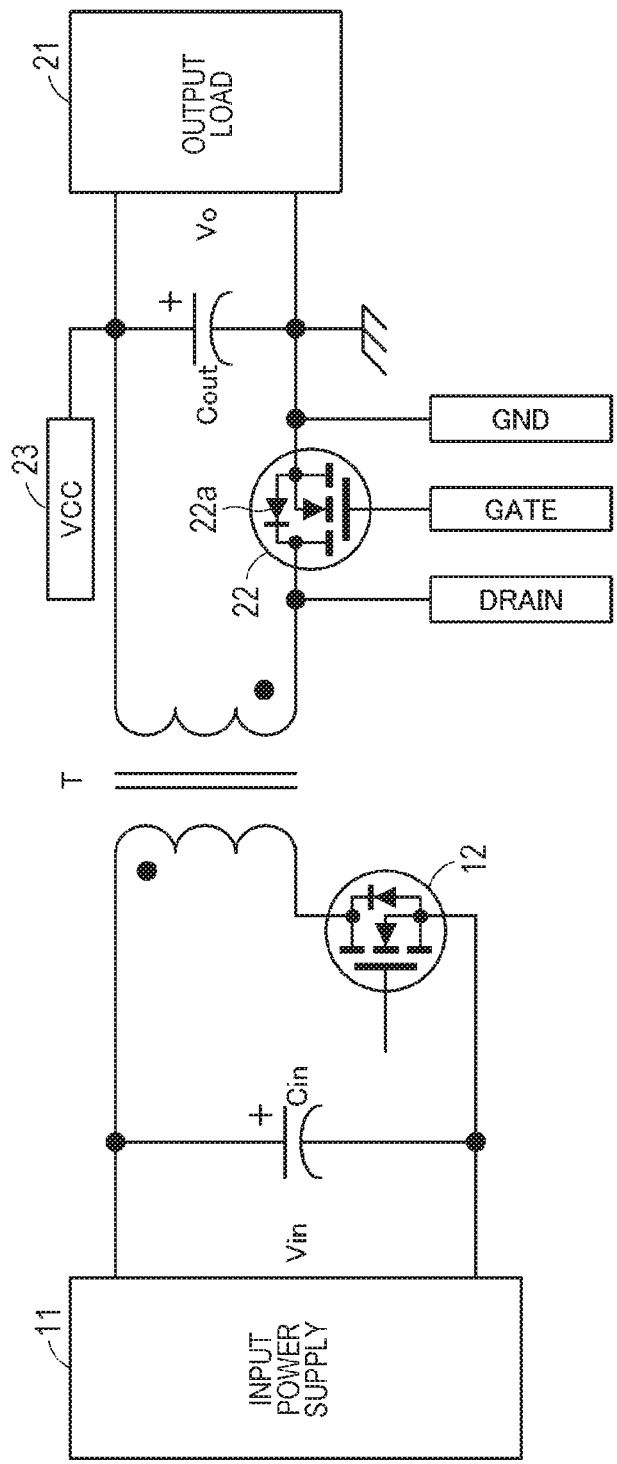
FIG. 1 is a diagram showing an example circuit configuration of a power supply circuit.

To facilitate understanding of the present disclosure, a general technology is first explained. FIG. 1 shows an example of a flyback switching power supply circuit (hereinafter referred to simply as the power supply system 1 as appropriate). On the primary side, the power supply system 1 includes an input power supply 11, a capacitor Cin disposed between output lines from the input power supply 11, and a metal oxide semiconductor field effect transistor (MOSFET) 12 that is an example of a switching element and is connected to the output line on the primary side. On the secondary side via a transformer T, the power supply system 1 further includes an output load 21, a smoothing capacitor Cout disposed between output lines connected to the output load 21, a MOSFET 22 connected to the output line on the secondary side, and a voltage collector (VCC) 23 that is a power supply voltage. The source terminal of the MOSFET 22 is grounded. Note that, in this example, N-channel MOSFETs are used as the MOSFETs 12 and 22.

Operation of the power supply system 1 is now described. In the power supply system 1, when the MOSFET 12 on the primary side is turned on, a voltage having a dot-side terminal on its positive side is generated at both ends of the secondary-side coil of the transformer T. At this point of time, no current flows while the MOSFET 22 for synchronous rectification is not on, and the voltage of the drain terminal has a positive value that is the sum of the output voltage Vo and the voltage generated in the secondary winding of the transformer T.

After that, when the MOSFET 12 is turned off, a voltage having a dot-side terminal on its negative side is generated at both ends of the secondary-side coil of the transformer T. At this point of time, while the MOSFET 22 is not on, a rectification current flows through a parasitic diode 22a between the drain and the source. The voltage between the drain and the source of the MOSFET 22 is the forward voltage Vf of the parasitic diode 22a. Since the source terminal is grounded in the power supply system 1 in this example, the voltage of the drain terminal using this as the reference is −Vf. While the MOSFET 22 is on at a sufficient level, on the other hand, the voltage between the drain and the source is the product of the rectification current flowing in the MOSFET 22 and the on-resistance of the MOSFET 22. Accordingly, the voltage of the drain terminal is a negative voltage proportional to the rectification current.

Here, in the technology disclosed in Patent Document 1 described above, the voltage of the drain terminal is detected, with the reference being the voltage of the source terminal. Control is then performed so that the MOSFET 22 is turned on when the voltage becomes smaller than a certain threshold Vth_on, and the MOSFET 22 is turned off when the voltage becomes larger than another threshold Vth_off. Here, Vth_on and Vth_off are both negative values, and are in the following relationship: Vth_on<Vth_off. In this manner, control is performed to maintain the synchronous rectification MOSFET 22 in an on-state only during the period during which the rectification current flows.

In practice, however, the MOSFET 22 for synchronous rectification has some parasitic inductance component. Therefore, an equivalent circuit in a state in which the MOSFET 22 is completely turned on is a circuit in which an inductance L and a resistor R are connected in series as shown in FIG. 2.

Since a voltage depending on fluctuations of the flowing current is generated in the inductance L, this parasitic inductance component affects the voltage between the drain and the source. This influence is now described, with reference to FIGS. 3A, 3B, 3C, and 3D in addition to FIG. 1. Note that the waveforms shown in FIGS. 3A, 3B, 3C, and 3D schematically show the magnitudes of currents and voltages.

Figure 3A:
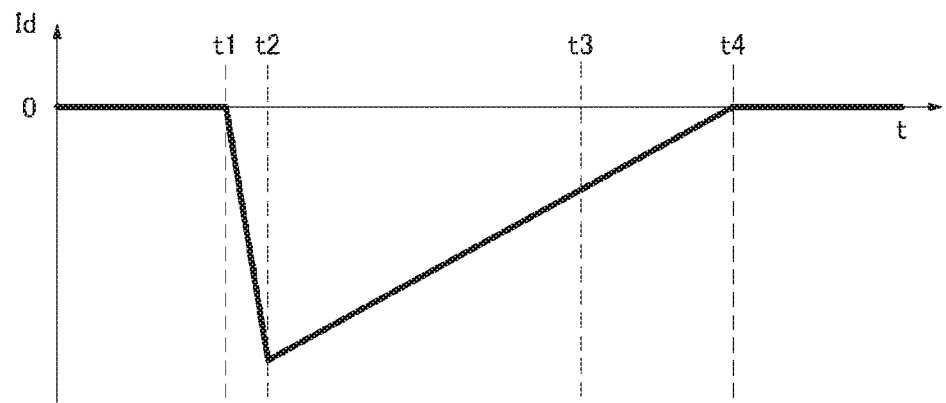
FIGS. 3A, 3B, 3C, and 3D are graphs to be referred to when a problem of a general technology is described.

For example, in the power supply system 1 shown in FIG. 1, a triangular-wave current flows as the rectification current (also referred to as the drain current) Id between the drain and the source of the MOSFET 22 (see FIG. 3A). Note that, since the current flows in the direction from the source terminal toward the drain terminal of the MOSFET 22, the rectification current Id has a negative value. Here, timing t1 is a timing when the MOSFET 12 is turned off. The rectification current Id starts flowing at this timing t1, rapidly increases in amount in the negative direction, and reaches a peak at timing t2. After that, the current gradually approaches 0, and the rectification current Id stops flowing at timing t4, and becomes 0.

Figure 3B:
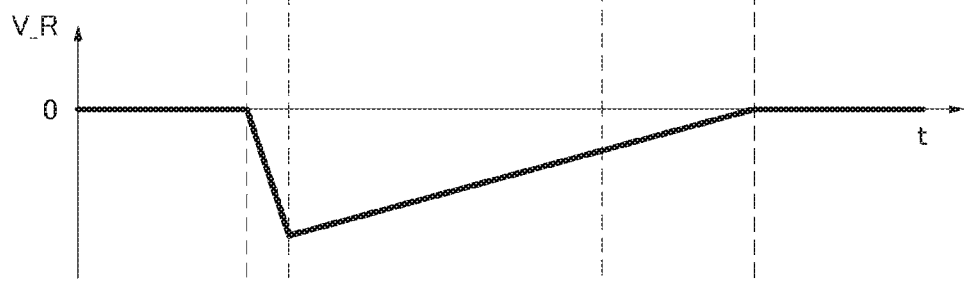
Figure 3C:
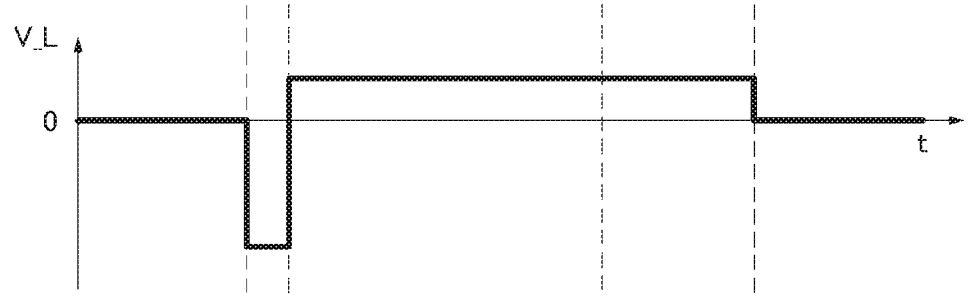
Figure 3D:
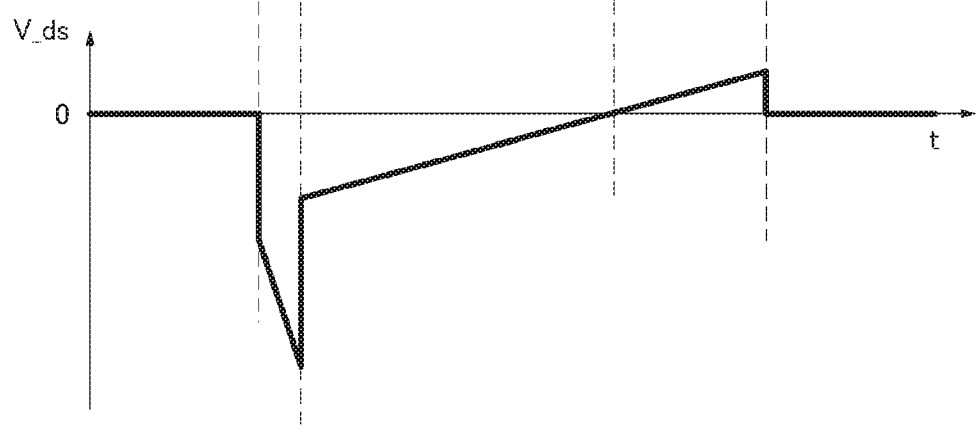

Assuming that the MOSFET 22 is maintained completely in an on-state during the period from timing t1 till timing t4, a voltage V_R proportional to the current value is generated in the resistance component of the MOSFET 22 (see FIG. 3B). On the other hand, since a voltage proportional to the current gradient is induced in the inductance component of the MOSFET 22, a voltage V_L is a negative voltage during the period from timing t1 till timing t2, and is a positive voltage during the period from timing t2 till timing t4 (see FIG. 3C). Since the voltage Vds of the drain terminal using the source terminal as the reference is the sum of the voltage V_R and the voltage V_L, the voltage Vds exceeds 0 at timing t3 between timing t2 and timing t4 (see FIG. 3D).

Therefore, according to the control method disclosed in Patent Document 1, the voltage between the drain and the source becomes larger than Vth_off while the rectification current Id is actually flowing. As a result, the MOSFET 22 is turned off. If the MOSFET 22 is turned off while the rectification current Id is flowing, the rectification current Id flows through the parasitic diode 22a of the MOSFET 22. At that time, however, the forward voltage Vf of the parasitic diode 22a, instead of the voltage generated at the on-resistance, is applied to the voltage Vds between the drain and the source, and therefore, the voltage Vds between the drain and the source again drops. After that, when the voltage Vds becomes equal to or lower than Vth_on, the MOSFET 22 is again turned on. As a result, the operation to turn on and off the MOSFET 22 is repeated.

To prevent such an operation, a blanking time for detection is secured at the time of transition from an on-state to an off-state and at the time of transition from an off-state to an on-state, and, once the MOSFET 22 is turned off, the MOSFET 22 may be maintained in an off-state during the rectification period (the period during which the rectification current Id flows). However, such control has a problem. The MOSFET 22 is on only during part of the rectification period, and the rectification current Id flows through the parasitic diode 22a of the MOSFET 22 during the remaining period. Therefore, loss is not sufficiently reduced. In the description below, an embodiment of the present disclosure will be described, with such a problem being taken into consideration.

1. Embodiment

[Example Configuration of a Synchronous Rectification Control Circuit]

FIG. 1 is a circuit diagram of a flyback switching power supply circuit (the power supply system 1) that receives power from an input power supply, and supplies predetermined power to an output load, as described above. The secondary side of the power supply system 1 is synchronously rectified, and a rectification current flows from the source terminal toward the drain terminal of the MOSFET 22. In the power supply system 1 in this example, one of the output windings on the secondary side is connected to the positive terminal of the smoothing capacitor Cout disposed on the secondary side, the other one of the output windings is connected to the drain terminal of the MOSFET 22, and the source terminal of the MOSFET 22 is connected to the negative terminal of the smoothing capacitor Cout.

A synchronous rectification control circuit 2 (not shown in FIG. 1) is provided as a circuit that is disposed on the secondary side and controls turning on/off of the MOSFET 22 that is an example of a synchronous rectification element. Note that turning on/off of the MOSFET 12 may be controlled by the synchronous rectification control circuit 2.

Figure 4:
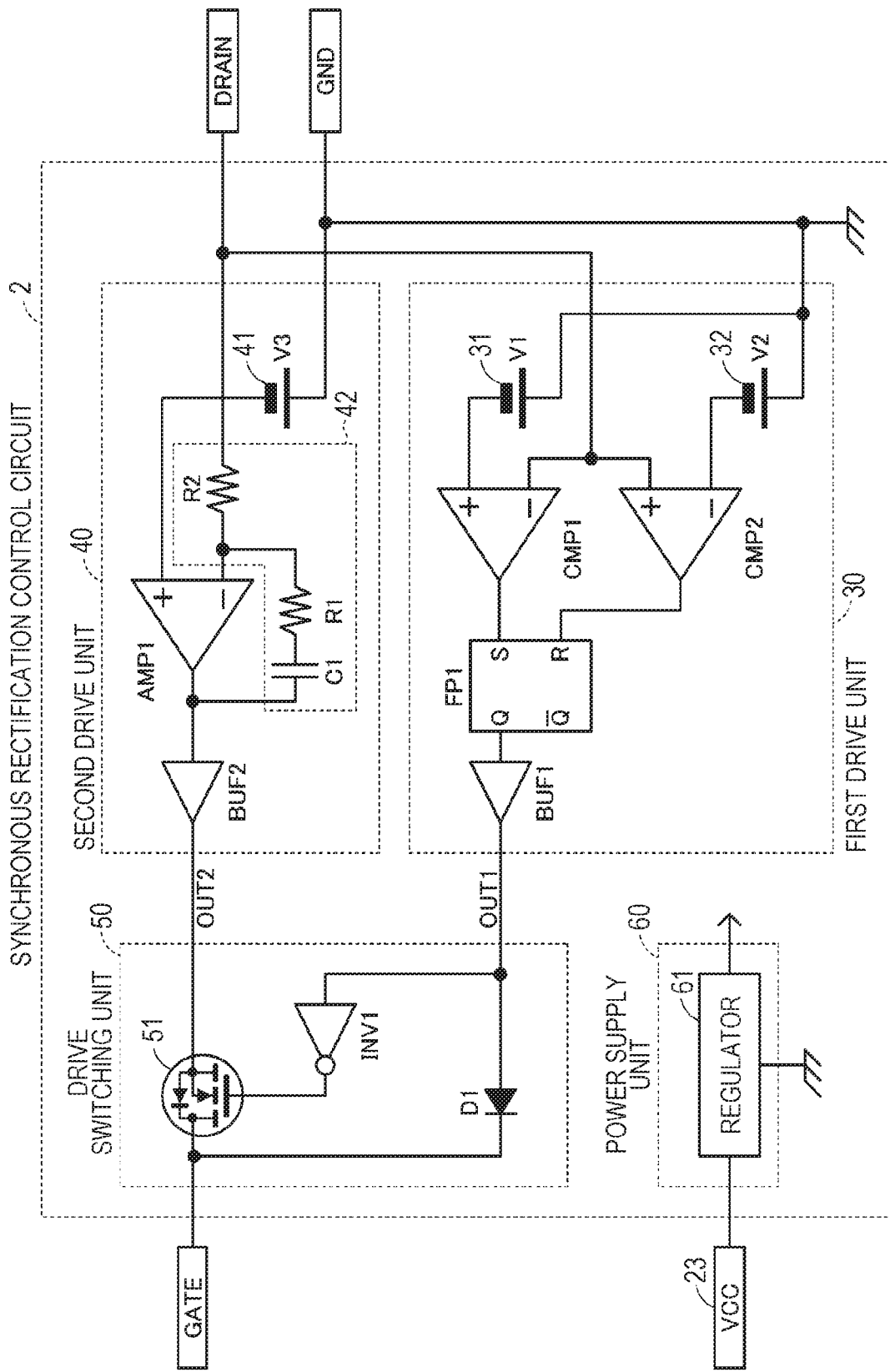
FIG. 4 is a diagram showing an example circuit configuration of a synchronous rectification control circuit according to an embodiment.

FIG. 4 is a circuit diagram showing an example configuration of the synchronous rectification control circuit 2. The synchronous rectification control circuit 2 includes a first drive unit 30, a second drive unit 40, a drive switching unit 50, and a power supply unit 60, for example. The input side of the first drive unit 30 is connected to the ground (GND) and the drain (DRAIN) terminal of the MOSFET 22. Likewise, the input side of the second drive unit 40 is connected to the ground and the drain terminal of the MOSFET 22. Further, the output sides of the first drive unit 30 and the second drive unit 40 are connected to the drive switching unit 50. The output of the drive switching unit 50 is connected to the gate (GATE) terminal of the MOSFET 22. Further, the power supply unit 60 is connected to the VCC 23 described above.

(First Drive Unit)

The first drive unit 30 includes a first comparator CMP1, a second comparator CMP2, a first reference voltage source 31 that outputs a first threshold voltage V1, and a second reference voltage source 32 that outputs a second threshold voltage V2, an SR flip-flop FP1, and a first buffer BUF1, for example. The non-inverting input terminal (the normal-phase input terminal) of the first comparator CMP1 is connected to the first reference voltage source 31. Further, the inverting input terminal (the reverse-phase input terminal) of the first comparator CMP1 is connected to the drain terminal of the MOSFET 22.

The non-inverting input terminal of the second comparator CMP2 is connected to the drain terminal of the MOSFET 22. Further, the inverting input terminal of the second comparator CMP2 is connected to the second reference voltage source 32. In this example, the source terminal of the MOSFET 22 is grounded, and is used as the reference for the first threshold voltage V1 and the second threshold voltage V2. The source terminal of the MOSFET 22 may be connected to a constant voltage source that outputs a predetermined voltage, and the voltage being output by the constant voltage source may be used as the reference voltage.

The output of the first comparator CMP1 is connected to the set (S) terminal of the SR flip-flop FP1. The output of the second comparator CMP2 is connected to the reset (R) terminal of the SR flip-flop FP1. The output of the SR flip-flop FP1 is connected to the input of the first buffer BUF1. The output of the first buffer BUF1 is connected to the drive switching unit 50. A signal for driving the MOSFET 22 is output from the first buffer BUF1. That is, a signal for controlling turning on/off of the MOSFET 22 is output from the first drive unit 30.

In a case where OUT1, which is the output of the first drive unit 30, is connected to the gate terminal of the MOSFET 22 under the control of the drive switching unit 50, the first drive unit 30 detects the voltage between the drain and the source of the MOSFET 22. When this voltage becomes smaller (lower) than the first threshold voltage V1, the first drive unit 30 outputs a signal for switching on the MOSFET 22, to maintain the on-state of the MOSFET 22. When this voltage becomes larger (higher) than the second threshold voltage V2, the first drive unit 30 outputs a signal for switching off the MOSFET 22, to maintain the off-state of the MOSFET 22.

(Second Drive Unit)

The second drive unit 40 includes an operational amplifier AMP1, a third reference voltage source 41 that outputs a third threshold voltage V3, an adjustment circuit 42 for adjusting the gain and the phase characteristics of the operational amplifier AMP1, and a second buffer BUF2, for example. The third reference voltage source 41 is connected to the non-inverting input terminal of the operational amplifier AMP1, and the drain terminal of the MOSFET 22 is connected to the inverting input terminal. Further, the third reference voltage source 41 is connected to the source terminal of the MOSFET 22. In this example, the source terminal of the MOSFET 22 is grounded, and serves as the reference for the third threshold voltage V3, in addition to the first threshold voltage V1 and second threshold voltage V2 described above.

The adjustment circuit 42 includes resistors R1 and R2, and a capacitor C1, for example. The series circuit formed with the resistor R1 and the capacitor C1 is connected between the input side of the inverting input terminal of the operational amplifier AMP1 and the output side of the operational amplifier AMP1, and the resistor R2 is connected between the inverting input terminal of the operational amplifier AMP1 and the drain terminal. The output of the operational amplifier AMP1 is connected to the second buffer BUF2. The output of the second buffer BUF2 is connected to the drive switching unit 50.

In a case where OUT2, which is the output of the second drive unit 40, is connected to the gate terminal of the MOSFET 22, the second drive unit 40 detects the voltage between the drain and the source of the MOSFET 22, and performs control to lower the drive voltage of the MOSFET 22 when this detected voltage is larger than the third threshold voltage V3, and raises the drive voltage when this detected voltage is smaller than the third threshold voltage V3. Thus, the voltage between the drain and the source of the MOSFET 22 is always equal to the third threshold voltage V3.

(Drive Switching Unit)

The drive switching unit 50 includes an N-channel MOSFET 51, an inverter INV1, and a diode D1, for example. The drain terminal of the MOSFET 51 is connected to the gate terminal (an example of the control terminal) of the MOSFET 22, and the source terminal of the MOSFET 51 is connected to the output side of the second drive unit 40. The output of the first drive unit 30 is branched, and the inverter INV1 is connected between one output side of the first drive unit 30 and the gate terminal of the MOSFET 51. The diode D1 has its anode terminal connected between the other output side of the first drive unit 30 and a connection midpoint between the drain terminal of the MOSFET 51 and the gate terminal of the MOSFET 22.

The drive switching unit 50 selectively supplies the output OUT1 of the first drive unit 30 and the output OUT2 of the second drive unit 40 to the gate terminal of the MOSFET 22. For example, the MOSFET 51 in the drive switching unit 50 is turned on/off in accordance with the output of the first drive unit 30 inverted by the inverter INV1. In a case where the MOSFET 51 is turned on, the output OUT2 of the second drive unit 40 is then supplied to the gate terminal of the MOSFET 22. Further, In a case where the MOSFET 51 is turned off, the output OUT2 of the first drive unit 30 is supplied to the gate terminal of the MOSFET 22 via an output line provided with the diode D1.

(Power Supply Unit)

The power supply unit 60 includes a constant voltage regulator 61, for example. The constant voltage regulator 61 converts power supplied from the VCC 23 in the power supply system 1 into an appropriate voltage, and then supplies the converted power to each block in the synchronous rectification control circuit 2.

[Example Operation of the Synchronous Rectification Control Circuit]

Figure 5:
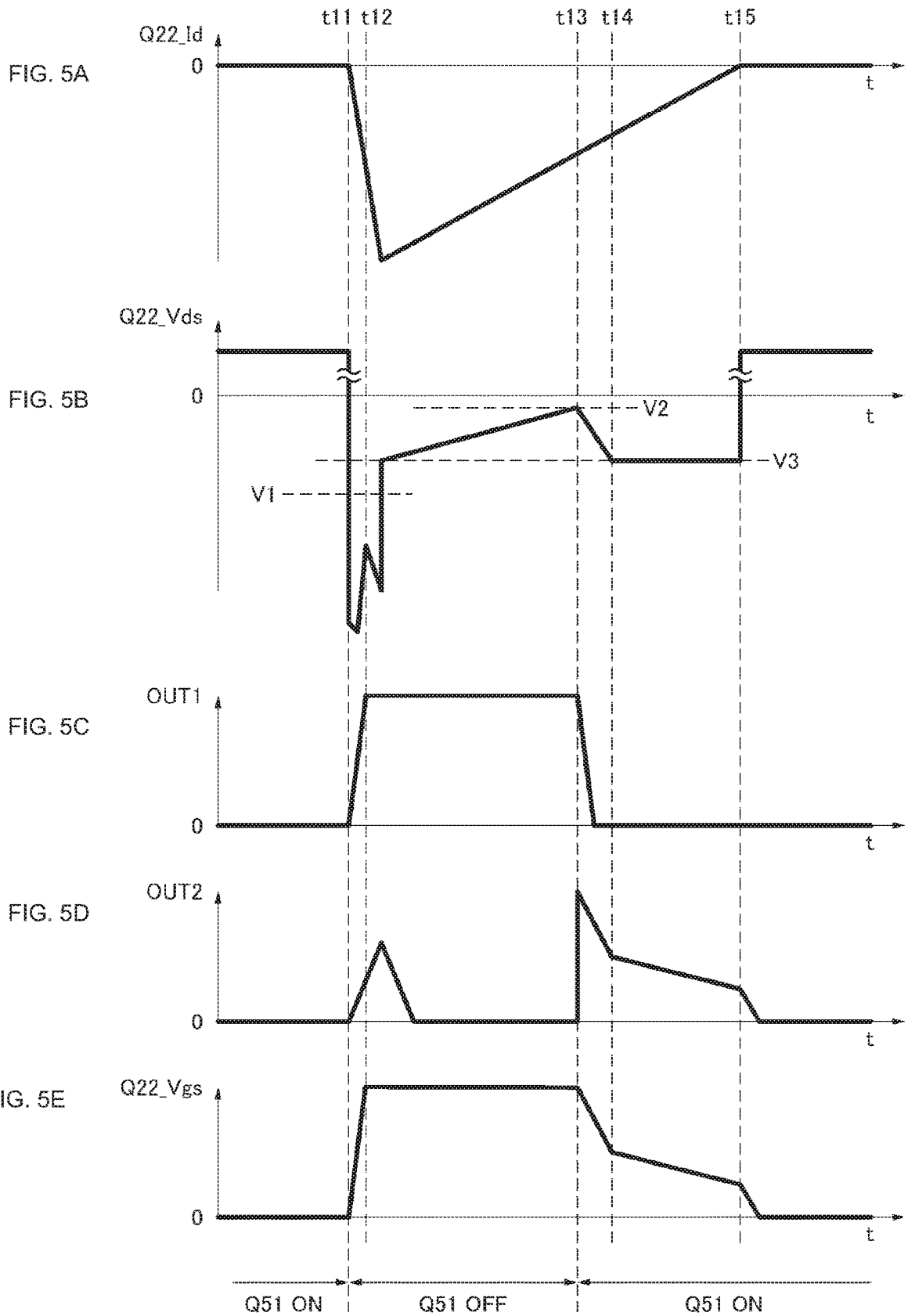
FIGS. 5A, 5B, 5C, 5D, and 5E are graphs to be referred to when an example operation of the synchronous rectification control circuit of an embodiment is described.

Next, an example operation of the synchronous rectification control circuit 2 is described, with reference to FIGS. 5A, 5B, 5C, 5D, and 5E. FIG. 5A shows temporal change of the rectification current Id. FIG. 5B shows temporal change of the voltage Vds between the drain and the source of the MOSFET 22. FIG. 5C shows temporal change of the output level of the first drive unit 30. FIG. 5D shows temporal change of the output level of the second drive unit 40. FIG. 5E shows temporal change of the voltage Vgs between the gate and the source of the MOSFET 22. Note that, in FIGS. 5A, 5B, 5C, 5D, and 5E, the MOSFET 22 is simply denoted by Q22, and the MOSFET 51 is simply denoted by Q51, due to limitations of space.

Note that the first threshold voltage V1, the second threshold voltage V2, and the third threshold voltage V3 are set to satisfy the following relationship with the forward voltage Vf of the parasitic diode 22a of the MOSFET 22: $-Vf < V1 < V3 < V2 < 0$. With respect to the voltage Vds between the drain and the source of the MOSFET 22, the output of the first drive unit 30 is as shown below in Table 1. Note that an output "1" in Table 1 indicates "high" (Hi: 5 V, for example), and an output "0" corresponds to "low" (Lo: 0 V, for example).

TABLE 1

|  | Vds < V1 | V1 < Vds < V2 | Vds > V2 |
|---|---|---|---|
| CMP1 output | 1 | 0 | 0 |
| CMP2 output | 0 | 0 | 1 |
| FP1 output | 1 | Previous state is maintained | 0 |

At timing t11, the MOSFET 12 is turned off, and the rectification current Id starts flowing. At this point of time, the rectification current Id has a negative value, because a current flows from the source terminal toward the drain terminal of the MOSFET 22. The rectification current Id has a triangular waveform indicating that the rectification current Id rapidly increases in amount in the negative direction since t11, reaches a peak, and then gradually approaches 0.

At timing t11, the MOSFET 22 is off, and accordingly, the rectification current Id flows through the parasitic diode 22a. Therefore, the voltage Vds between the drain and the source of the MOSFET 22 becomes a negative voltage that is the sum of the voltage Vf of the parasitic diode 22a and the voltage induced by parasitic inductance. Since this voltage is lower (smaller) than the first threshold voltage V1, the signal level output from the first comparator CMP1 becomes "high", and the signal level output from the second comparator CMP2 becomes "low" (see Table 1). Accordingly, the signal level output from the SR flip-flop FP1 becomes "high".

The high-level signal output from the first drive unit 30 is branched, and is supplied to the diode D1 and the inverter INV1. The high-level signal output from the first drive unit 30 is inverted by the inverter INV1, and the low-level signal after the inversion is supplied to the gate terminal of the MOSFET 51 of the drive switching unit 50. Thus, the MOSFET 51 is turned off, and the output of the second drive unit 40 is shut off (cut off).

The high-level signal output from the first drive unit 30 is also supplied to the gate terminal of the MOSFET 22 via the diode D1. The gate terminal voltage (Vgs) of the MOSFET 22 rises, and the MOSFET 22 is eventually turned on. When the MOSFET 22 is turned on, the voltage equivalent to Vf due to the parasitic diode 22a can be reduced, and accordingly, the voltage Vds becomes closer to 0.

For example, at timing t12, the MOSFET 22 is completely in an on-state, and Vds becomes a negative voltage that is the sum of the voltage drop due to the on-resistance and the voltage induced by the parasitic inductance. Eventually, when the rectification current Id exceeds the peak and starts approaching 0, Vds also gradually approaches 0.

When Vds becomes larger than the second threshold voltage V2 at timing t13, the level of the signal output from the first drive unit 30 becomes "low" (see Table 1). The signal output from the first drive unit 30 is supplied to the gate terminal of the MOSFET 51, after the level thereof is inverted to "high" by the inverter INV1. As a result, the MOSFET 51 of the drive switching unit 50 is turned on. Accordingly, the gate terminal of the MOSFET 22 is connected to the output of the second drive unit 40, and a signal based on the control of the second drive unit 40 is supplied to the gate terminal of the MOSFET 22. The second drive unit 40 operates to adjust the gate voltage of the MOSFET 22 so that the voltage Vds becomes equal to the third threshold voltage V3.

By the operation of the second drive unit 40, the voltage Vds is made to become equal to the third threshold voltage V3 at timing t14, and control is performed so that this state is maintained during a predetermined period during which the rectification current Id flows (in this example, the predetermined period is the period from timing t14 till timing t15 at which the rectification current stops flowing).

After timing t14, the rectification current Id further approaches 0. Further, when the rectification current Id becomes 0 at timing t15, it is no longer possible to maintain the voltage Vds of the MOSFET 22 at the third threshold voltage V3. As a result, the gate voltage of the MOSFET 22 becomes 0, and the MOSFET 22 is turned off. This state is maintained until the rectification current Id starts flowing in the next rectification period, and thus, backflow of the current during the rectification-off period is prevented. In this manner, the state in which the MOSFET 22 is on can be maintained during almost all the periods during which the rectification current Id flows. Thus, the MOSFET 22 can be prevented from being repeatedly turned on/off during each period during which the rectification current Id flows, and conduction loss of the MOSFET 22 can be reduced. Further, when the rectification current Id becomes 0, the MOSFET 22 can be turned off at the same time or almost at the same time. Thus, it is possible to obtain a synchronous rectification control circuit that prevents backflow of current, and is stable having low loss.

2. Modifications

Although an embodiment of the present disclosure has been specifically described so far, the contents of the present disclosure are not limited to the above embodiment, and various modifications based on the technical idea of the present disclosure may be made to the embodiment.

In the embodiment described above, a flyback switching converter has been described. However, the present disclosure is not limited to this. Also, in the description above, a half-wave rectifier circuit that has a rectification element on the ground side and outputs a positive voltage has been described as a rectification circuit. However, the present disclosure is not limited to this. The present disclosure can be applied to various switching converters and the rectification circuits thereof. For example, even in a case where the same flyback switching converter outputs a negative voltage or has the rectification element not on the ground side, the present disclosure can be applied on the basis of an idea similar to that of the above embodiment, though the polarity or the like in voltage detection might become the opposite depending on the configuration.

The present disclosure can also be applied likewise in a case where a current-resonance converter is used as a switching converter, and a two-wave rectifier circuit is used as the rectifier circuit thereof. Further, the present disclosure can be applied to a forward converter, a phase-shift full-bridge converter, and the like. Furthermore, the output on the secondary side may be of a center tap type. In such a configuration, the center tap is connected to the positive terminal of the smoothing capacitor on the secondary side, both ends are connected to the synchronous rectification elements, and the other side of each synchronous rectification element is connected to the negative terminal of the smoothing capacitor.

The circuit configuration of each block described as an example in the embodiment is a preferred configuration but is an example, and the present disclosure is not limited to this. For example, in the embodiment, a circuit that uses two comparators and an SR flip-flop has been described as an example of the circuit configuration of the first drive unit 30. However, the first drive unit 30 is not limited to this configuration, and may have some other circuit configuration that is capable of achieving the functions described in the embodiment. The same applies to the second drive unit 40, the drive switching unit 50, and the power supply unit 60.

Some other element such as an insulated gate bipolar transistor (IGBT) may be used as a switching element. Further, the switching cycle and the rectification period corresponding to the switching cycle can be set as appropriate.

The configurations, the methods, the procedures, the shapes, the materials, the numerical values, and the like mentioned in the embodiment described above are merely examples, and configurations, methods, procedures, shapes, materials, numerical values, and the like that differ from those mentioned above may be included as necessary. Further, the matters described in the embodiment and the modifications may be combined with each other, as long as no technical contradiction occurs. Furthermore, the present disclosure can be embodied in an appropriate form, such as a power supply system including a synchronous rectification control circuit, a control method implemented in a synchronous rectification control circuit, and an applied device using a synchronous rectification control circuit.

Note that the present disclosure may also be embodied in the configurations described below.

(1)

A synchronous rectification control circuit including:

a first drive unit that outputs a signal for controlling turning on/off of a synchronous rectification element disposed on a secondary side;

a second drive unit that performs control to make a voltage between both ends of the synchronous rectification element equal to a predetermined threshold voltage, during a predetermined period during which a rectification current flows on the secondary side; and a drive switching unit that selectively supplies an output from the first drive unit and an output from the second drive unit to the synchronous rectification element.

(2)

The synchronous rectification control circuit according to (1), in which, when the first drive unit outputs a signal for turning on the synchronous rectification element, the drive switching unit supplies the signal to the synchronous rectification element, and when the first drive unit outputs a signal for turning off the synchronous rectification element, the drive switching unit supplies a signal based on control of the second drive unit to the synchronous rectification element.

(3)

The synchronous rectification control circuit according to (1) or (2), in which the first drive unit detects a voltage between both ends of the synchronous rectification element, outputs a signal for turning on the synchronous rectification element when the voltage is lower than a first threshold voltage, and outputs a signal for turning off the synchronous rectification element when the voltage is higher than the second threshold voltage.

(4)

The synchronous rectification control circuit according to (3), in which the first drive unit includes:

an SR flip-flop;

a first comparator whose output is connected to a set terminal of the SR flip-flop;

a second comparator whose output is connected to a reset terminal of the SR flip-flop;

a first reference voltage source that is connected to a non-inverting input of the first comparator, and outputs the first threshold voltage;

a second reference voltage source that is connected to an inverting input of the second comparator, and outputs the second threshold voltage; and a first buffer that receives an output of the SR flip-flop as an input, and outputs a signal for driving the synchronous rectification element in accordance with the input.

(5)

The synchronous rectification control circuit according to (4), in which the synchronous rectification element is a MOSFET, an inverting input of the first comparator and a non-inverting input of the second comparator are connected to a drain terminal of the MOSFET, and a source terminal of the MOSFET serves as a reference for the first threshold voltage and the second threshold voltage.

(6)

The synchronous rectification control circuit according to any one of (3) to (5), in which the predetermined period is a period from when the voltage between both ends of the synchronous rectification element reaches the second threshold voltage till when the rectification current stops flowing.

(7)

The synchronous rectification control circuit according to any one of (3) to (6), in which the second drive unit includes:

an operational amplifier;

a third reference voltage source that is connected to a non-inverting input of the operational amplifier, and outputs a third threshold voltage that is the predetermined threshold voltage;

an adjustment circuit that adjusts a gain and a phase of the operational amplifier; and a second buffer that receives an output of the operational amplifier as an input, and outputs a signal for driving the synchronous rectification element in accordance with the input.

(8)

The synchronous rectification control circuit according to (7), in which the synchronous rectification element is a MOSFET, an inverting input of the operational amplifier is connected to a drain terminal of the MOSFET, and a source terminal of the MOSFET serves as a reference for the first threshold voltage, the second threshold voltage, and the third threshold voltage.

(9)

The synchronous rectification control circuit according to (8), in which a relationship is set to satisfy the first threshold voltage<the third threshold voltage<the second threshold voltage<0.

(10)

The synchronous rectification control circuit according to any one of (1) to (9), in which the drive switching unit includes:

a switching element that performs switching on/off in accordance with an inverted output of the first drive unit, and supplies an output of the second drive unit to a control terminal of the synchronous rectification element when turned on; and an output line that supplies an output of the first drive unit to the control terminal of the synchronous rectification element when the switching element is turned off.

(11)

The synchronous rectification control circuit according to (10), in which the drive switching unit includes:

a MOSFET as the switching element whose source terminal is connected to an output from the second drive unit, and whose drain terminal is connected to the control terminal of the synchronous rectification element;

an inverter that is connected between an output side of the first drive unit and a gate terminal of the MOSFET; and a diode whose anode terminal is connected to the output side of the first drive unit, and whose cathode terminal is connected to a connection midpoint between the drain terminal of the MOSFET and the control terminal of the synchronous rectification element.

(12)

The synchronous rectification control circuit according to any one of (1) to (11), in which the synchronous rectification element is an N-channel MOSFET, and the rectification current flows from a source terminal toward a drain terminal of the MOSFET.

(13)

The synchronous rectification control circuit according to (12), in which one of output windings on the secondary side is connected to a positive terminal of a smoothing capacitor disposed on the secondary side, the other one of the output windings is connected to a drain terminal of the MOSFET, and a source terminal of the MOSFET is connected to a negative terminal of the smoothing capacitor.

(14)

The synchronous rectification control circuit according to any one of (1) to (13), further including a power supply unit that supplies electric power for the first drive unit, the second drive unit, and the drive switching unit to operate.

(15)

A control method implemented in a synchronous rectification control circuit, the control method including:

outputting a signal for controlling turning on/off of a synchronous rectification element disposed on a secondary side, a first drive unit performing the outputting;

performing control to make a voltage between both ends of the synchronous rectification element equal to a predetermined threshold voltage during a predetermined period during which a rectification current flows on the secondary side, a second drive unit performing the control; and selectively supplying an output from the first drive unit and an output from the second drive unit to the synchronous rectification element, a drive switching unit performing the selective supplying.

(16)

A power supply system that has an input power supply connected to a primary side, and a load connected to a secondary side, the power supply system including
the synchronous rectification circuit according to any one of (1) to (14), which controls a synchronous rectification element disposed on the secondary side.

(17)

An electronic apparatus that receives an electric power supply from the power supply system according to (16).

(18)

An electric vehicle including: a conversion device that receives a supply of electric power from the power supply system according to (16), and converts the electric power into vehicle drive power; and a control device that performs information processing related to vehicle control on the basis of information about the power supply system.

(19)

An electric power system including
a power information transmission/reception unit that transmits and receives a signal to and from another device via a network,
the electric power system performing charge/discharge control on the power supply system according to (16), on the basis of information received by the power information transmission/reception unit.

(20)

An electric power system that receives a supply of electric power from the power supply system according to (16), or supplies electric power to the power supply system from a power generating unit or a power network.

3. Example Applications

The technology according to the present disclosure may be applied to various products. For example, the present disclosure can be embodied as a power supply system including the synchronous rectification control circuit according to the embodiment described above. Further, such a power supply system may be embodied as a device mounted on any type of moving object, such as an automobile, an electrical vehicle, a hybrid electrical vehicle, a motorcycle, a bicycle, a personal mobility device, an airplane, a drone, a vessel, a robot, a construction machine, or an agricultural machine (a tractor). In the description below, specific examples of applications will be described, but the contents of the present disclosure are not limited to the example applications described below.

[Power Storage System in a Vehicle as an Example Application]

Figure 6:
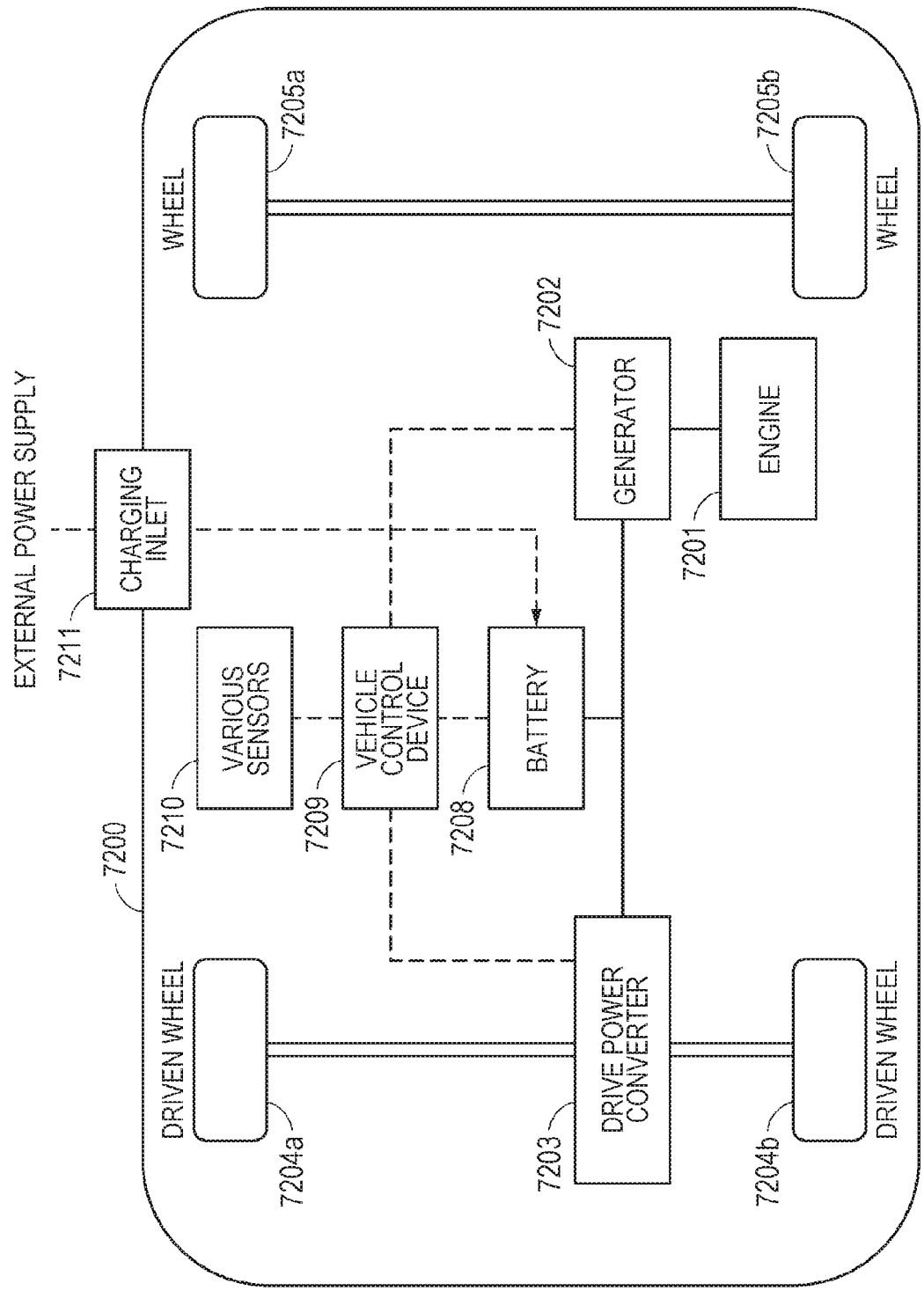
FIG. 6 is a diagram for describing an example application of the present disclosure.

Referring now to FIG. 6, an example in which the present disclosure is applied to a power storage system for vehicles is described. FIG. 6 schematically shows an example configuration of a hybrid vehicle that adopts a series hybrid system to which the present disclosure is applied. A series hybrid system is a car that is powered by a drive power converter, using electric power generated by a generator that is run by an engine or the electric power that is temporarily stored in a battery.

This hybrid vehicle 7200 includes an engine 7201, a generator 7202, a drive power converter 7203, a driven wheel 7204a, a driven wheel 7204b, a wheel 7205a, a wheel 7205b, a battery 7208, a vehicle control device 7209, various sensors 7210, and a charging inlet 7211. The synchronous rectification control circuit according to the embodiment of the present disclosure described above is applied to the control circuit of the battery 7208 and the circuit of the vehicle control device 7209.

The hybrid vehicle 7200 runs with the drive power converter 7203 serving as the power source. An example of the drive power converter 7203 is a motor. The drive power converter 7203 is activated by the power of the battery 7208, and the rotative force of the drive power converter 7203 is transferred to the driven wheels 7204a and 7204b. Note that, as DC-AC conversion or reverse conversion (AC-DC conversion) is performed at appropriate sites, either an AC motor or a DC motor can be used as the drive power converter 7203. The various sensors 7210 control the engine revolving speed via the vehicle control device 7209, and control the opening (throttle position) of a throttle valve (not shown). The various sensors 7210 include a velocity sensor, an acceleration sensor, an engine revolving speed sensor, and the like.

The rotative force of the engine 7201 is transferred to the generator 7202, and, by virtue of the rotative force, electric power generated by the generator 7202 can be stored in the battery 7208.

As the hybrid vehicle slows down with a braking mechanism (not shown), the resisting force during the deceleration is applied as rotative force to the drive power converter 7203, and regenerative power generated from the rotative force by the drive power converter 7203 is stored in the battery 7208.

The battery 7208 can be connected to a power supply outside the hybrid vehicle, so as to receive a power supply from the external power supply through the charging inlet 7211 serving as a power inlet, and store the received electric power.

Although not shown in the drawing, an information processing device that performs information processing related to vehicle control, on the basis of information about the secondary cells may also be provided. Such an information processing device may be an information processing device that indicates a remaining battery level, on the basis of information about the remaining battery level, for example.

Note that, in the above description, a series hybrid car that is powered by a motor using electric power generated by a generator that is run by the engine or the electric power that is temporarily stored in the battery has been described as an example. However, the present disclosure can also be effectively applied to a parallel hybrid car that uses power outputs from both an engine and a motor serving as drive sources, and switches among three methods: being powered only by the engine, being powered only by the motor, and being powered by both the engine and the motor. Further, the present disclosure can also be effectively applied to a so-called electric vehicle that does not use an engine and is driven only by a drive motor.

An example of the hybrid vehicle 7200 to which the technology according to the present disclosure can be applied has been described. The synchronous rectification control circuit or the power supply system including the synchronous rectification control circuit according to the embodiment of the present disclosure can be applied to the battery 7208 or a circuit related thereto, for example.

[Power Storage System in a Residence as an Example Application]

Figure 7:
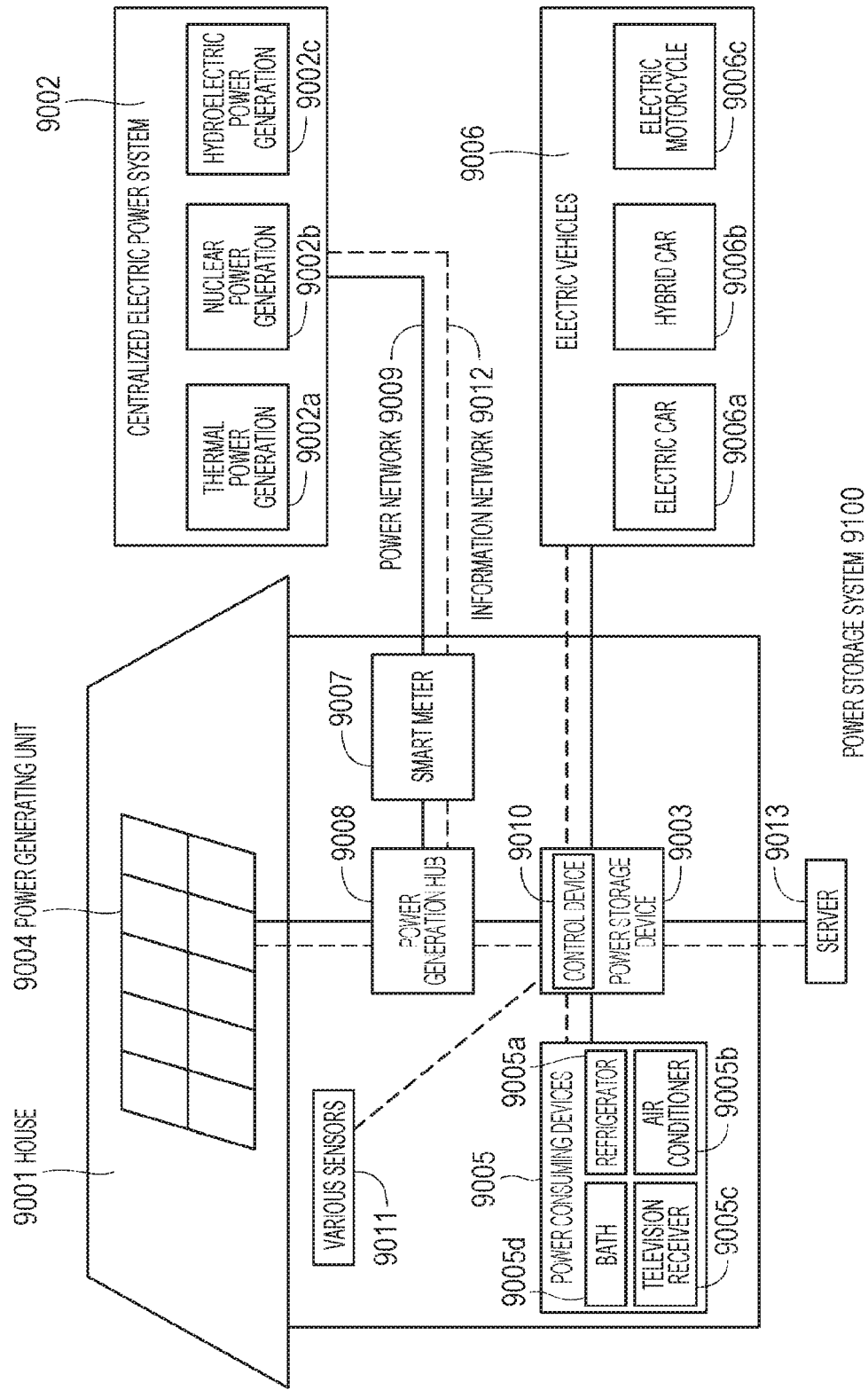
FIG. 7 is a diagram for explaining another example application of the present disclosure.

Referring now to FIG. 7, an example in which the present disclosure is applied to a residential power storage system is described. In a power storage system 9100 for a house 9001, for example, electric power is supplied to a power storage device 9003 from a centralized electric power system 9002 such as thermal power generation 9002a, nuclear power generation 9002b, and hydroelectric power generation 9002c, via a power network 9009, an information network 9012, a smart meter 9007, a power generation hub 9008, and the like. In conjunction with this, electric power from an independent power supply such as a household power generating unit 9004 is supplied to the power storage device 9003. The supplied power is stored in the power storage device 9003. With the power storage device 9003, the electric power to be used in the house 9001 is supplied to the house 9001. A similar power storage system can be used not only in the house 9001 but also in an office building.

The power generating unit 9004, power consuming devices 9005, the power storage device 9003, a control device 9010 that controls the respective devices, the smart meter 9007, and sensors 9011 that acquire various kinds of information are provided in the house 9001. The respective devices are connected by the power network 9009 and the information network 9012. Solar cells, fuel cells, or the like are used as the power generating unit 9004, and generated electric power is supplied to the power consuming devices 9005 and/or the power storage device 9003. The power consuming devices 9005 are a refrigerator 9005*a*, an air conditioner 9005*b*, a television receiver 9005*c*, a bath 9005*d*, and the like. The power consuming devices 9005 further include electric vehicles 9006. The electric vehicles 9006 are an electrical vehicle 9006*a*, a hybrid car 9006*b*, and an electric motorcycle 9006*c*.

The synchronous rectification control circuit according to the embodiment of the present disclosure described above is applied to a peripheral circuit of the power storage device 9003. The smart meter 9007 has the function to measure commercial power usage, and transmit the measured usage to the electric power company. The power network 9009 may be one of or a combination of a DC power supply, an AC power supply, and a non-contact power supply.

The various sensors 9011 may be a motion sensor, an illuminance sensor, an object sensor, a power consumption sensor, a vibration sensor, a contact sensor, a temperature sensor, an infrared sensor, and the like, for example. Information acquired by the various sensors 9011 is transmitted to the control device 9010. Weather conditions, the conditions of a person, and the like are determined from the information transmitted from the sensors 9011, and the power consuming devices 9005 can be automatically controlled so as to minimize energy consumption. Further, the control device 9010 can transmit information about the house 9001 to an external electric power company or the like via the Internet.

The power generation hub 9008 performs processing such as power line branching or DC-AC conversion. The communication method used by the information network 9012 connected to the control device 9010 may be a method using a communication interface such as Universal Asynchronous Receiver-Transmitter (UART), or a method using a sensor network compliant with wireless communication standards such as Bluetooth (registered trademark), ZigBee (registered trademark), or Wi-Fi (registered trademark). Bluetooth (registered trademark) is used in multimedia communication, and enables point-to-multipoint communication. ZigBee (registered trademark) uses physical layers of Institute of Electrical and Electronics Engineers (IEEE) 802.15.4. IEEE802.15.4 is the name of short-range wireless network standards called Personal Area Network (PAN) or Wireless (W) PAN.

The control device 9010 is connected to an external server 9013. This server 9013 may be managed by the house 9001, the electric power company, or the service provider. The information to be transmitted and received by the server 9013 is power consumption information, life pattern information, electric power charges, weather information, natural hazard information, and information related to electricity trading, for example. These pieces of information may be transmitted and received by a power consuming device in the house (such as a television receiver, for example), but may be transmitted and received by a device outside the house (such as a portable telephone device, for example). These pieces of information may be displayed on a device having a display function, such as a television receiver, a portable telephone device, or a Personal Digital Assistant (PDA), for example.

The control device 9010 that controls the respective components is formed with a central processing unit (CPU), a random access memory (RAM), a read only memory (ROM), and the like, and is included in the power storage device 9003 in this example. The control device 9010 is connected to the power storage device 9003, the household power generating unit 9004, the power consuming devices 9005, the various sensors 9011, and the server 9013 by the information network 9012, and has the function to adjust electricity usage and power generation, for example. Note that the control device 9010 may also have the function to conduct electricity trading in the electricity market and the like, in addition to the above function.

As described above, not only electric power generated from the centralized electric power system 9002 such as the thermal power 9002*a*, the nuclear power 9002*b*, and the hydroelectric power 9002*c*, but also electric power generated from the household power generating unit 9004 (solar power generation and wind power generation) can be stored in the power storage device 9003. Accordingly, even when the electric power generated from the household power generating unit 9004 varies, control can be performed so that the amount of power to be sent out can be made constant, and only the necessary amount of power is discharged. For example, while electric power obtained through solar power generation is stored in the power storage device 9003, less expensive night-time electric power is stored in the power storage device 9003 at night, so that the electric power stored in the power storage device 9003 can be discharged and used in expensive hours during the day.

Although the control device 9010 is included in the power storage device 9003 in the above described example, the control device 9010 may be included in the smart meter 9007 or may be formed as an independent device. Further, the power storage system 9100 may be used in households in an apartment building, or may be used in detached houses.

An example of the power storage system 9100 to which the technique according to the present disclosure can be applied has been described above. The technology according to the present disclosure can be suitably applied to the power storage device 9003 in the configuration described above. Specifically, the synchronous rectification control circuit according to one embodiment or a power supply system including the circuit can be applied to a circuit related to the power storage device 9003.

REFERENCE SIGNS LIST

1 Power supply circuit
2 Synchronous rectification control circuit
22, 51 MOSFET
22*a* Parasitic diode
30 First drive unit
31 First reference voltage source
32 Second reference voltage source
40 Second drive unit
41 Third reference voltage source 42 Adjustment circuit
50 Drive switching unit
60 Power supply unit
CMP1, CMP2 Comparator
FP1 SR flip-flop
BUF1 First buffer
AMP1 Operational amplifier
BUF2 Second buffer
INV1 Inverter
D1 Diode

The invention claimed is:

1. A synchronous rectification control circuit, comprising:
a first drive unit configured to:
detect a voltage between both sides of a synchronous rectification element, wherein the synchronous rectification element is on a secondary side of a power supply system;
output a first signal to turn on the synchronous rectification element based on the voltage that is lower than a first threshold voltage; and
output a second signal to turn off the synchronous rectification element based on the voltage that is higher than a second threshold voltage;
a second drive unit configured to control the voltage during a specific period, wherein
the specific period corresponds to a period during which a rectification current flows on the secondary side,
the specific period includes a start time and an end time,
the start time corresponds to a time at which the voltage reaches the second threshold voltage, and
the end time corresponds to a time at which the rectification current stops flowing; and
a drive switching unit configured to selectively supply an output from the first drive unit and an output from the second drive unit to the synchronous rectification element.

2. The synchronous rectification control circuit according to claim 1, wherein
based on output of the first signal from the first drive unit, the drive switching unit is further configured to supply the first signal to the synchronous rectification element, and
the drive switching unit is further configured to supply the second signal to the synchronous rectification element based on control of the second drive unit and output of the second signal from the first drive unit.

3. The synchronous rectification control circuit according to claim 1, wherein the first drive unit includes:
an SR flip-flop;
a first comparator, wherein an output terminal of the first comparator is connected to a set terminal of the SR flip-flop;
a second comparator, wherein an output terminal of the second comparator is connected to a reset terminal of the SR flip-flop;
a first reference voltage source that is connected to a non-inverting input of the first comparator, wherein the first reference voltage source is configured to output the first threshold voltage;
a second reference voltage source that is connected to an inverting input of the second comparator, wherein the second reference voltage source is configured to output the second threshold voltage; and
a buffer configured to receive an output of the SR flip-flop as an input, wherein the buffer is configured to output a third signal to drive the synchronous rectification element, and
the third signal is outputted based on the input.

4. The synchronous rectification control circuit according to claim 3, wherein
the synchronous rectification element is a MOSFET,
an inverting input of the first comparator and a non-inverting input of the second comparator are connected to a drain terminal of the MOSFET, and
a source terminal of the MOSFET is configured to serve as a reference for the first threshold voltage and the second threshold voltage.

5. The synchronous rectification control circuit according to claim 1, wherein the second drive unit includes:
an operational amplifier;
a first reference voltage source that is connected to a non-inverting input of the operational amplifier, wherein
the first reference voltage source is configured to output a third threshold voltage;
an adjustment circuit configured to adjust a gain and a phase of the operational amplifier; and
a buffer configured to:
receive an output of the operational amplifier as an input; and
output a third signal to drive the synchronous rectification element, wherein the third signal is outputted based on the input.

6. The synchronous rectification control circuit according to claim 5, wherein
the synchronous rectification element is a MOSFET,
an inverting input of the operational amplifier is connected to a drain terminal of the MOSFET, and
a source terminal of the MOSFET is configured to serve as a reference for the first threshold voltage, the second threshold voltage, and the third threshold voltage.

7. The synchronous rectification control circuit according to claim 6, wherein the first threshold voltage <the third threshold voltage <the second threshold voltage <0.

8. The synchronous rectification control circuit according to claim 1, wherein the drive switching unit includes:
a switching element configured to:
switch between an on state and an off state based on an inverted output of the first drive unit; and
supply the output of the second drive unit to a control terminal of the synchronous rectification element based on the on state of the switching element; and
an output line configured to supply the output of the first drive unit to the control terminal of the synchronous rectification element based on the off state of the switching element.

9. The synchronous rectification control circuit according to claim 8, wherein the drive switching unit includes:
a MOSFET as the switching element, wherein the MOSFET includes a source terminal connected to the output from the second drive unit and a drain terminal connected to the control terminal of the synchronous rectification element;
an inverter that is connected between an output side of the first drive unit and a gate terminal of the MOSFET; and
a diode, wherein
an anode terminal of the diode is connected to the output side of the first drive unit, and
a cathode terminal of the diode is connected to a connection midpoint between the drain terminal of the MOSFET and the control terminal of the synchronous rectification element.

10. The synchronous rectification control circuit according to claim 1, wherein
the synchronous rectification element is an N-channel MOSFET, and
the rectification current flows from a source terminal toward a drain terminal of the N-channel MOSFET.

11. The synchronous rectification control circuit according to claim 10, wherein
output windings on the secondary side include a first winding and a second winding,
the first winding is connected to a positive terminal of a smoothing capacitor,
the smoothing capacitor is on the secondary side,
the second winding is connected to the drain terminal of the N-channel MOSFET, and
the source terminal of the N-channel MOSFET is connected to a negative terminal of the smoothing capacitor.

12. The synchronous rectification control circuit according to claim 1, further comprising a power supply unit configured to supply electric power to operate the first drive unit, the second drive unit, and the drive switching unit.

13. A control method implemented in a synchronous rectification control circuit, the control method comprising:
detecting, by a first drive unit, a voltage between both sides of a synchronous rectification element, wherein the synchronous rectification element is on a secondary side of a power supply system;
outputting, by the first drive unit, a first signal to turn on the synchronous rectification element based on the voltage that is lower than a first threshold value;
outputting, by the first drive unit, a second signal to turn off the synchronous rectification element based on the voltage that is higher than a second threshold voltage;
controlling, by a second drive unit, the voltage between during a specific period, wherein
the specific period corresponds to a period during which a rectification current flows on the secondary side,
the specific period includes a start time and an end time,
the start time corresponds to a time at which the voltage reaches the second threshold voltage, and
the end time corresponds to a time at which the rectification current stops flowing; and
selectively supplying, by a drive switching unit, an output from the first drive unit and an output from the second drive unit to the synchronous rectification element.

14. A power supply system that has an input power supply connected to a primary side and a load connected to a secondary side, the power supply system comprising:
a synchronous rectification circuit that comprises:
a first drive unit configured to:
detect a voltage between both sides of a synchronous rectification element, wherein the synchronous rectification element is on the secondary side;
output a first signal to turn on the synchronous rectification element based on the voltage that is lower than a first threshold voltage; and
output a second signal to turn off the synchronous rectification element based on the voltage that is higher than a second threshold voltage;
a second drive unit configured to control the voltage during a specific period, wherein
the specific period corresponds to a period during which a rectification current flows on the secondary side,
the specific period includes a start time and an end time,
the start time corresponds to a time at which the voltage reaches the second threshold voltage, and
the end time corresponds to a time at which the rectification current stops flowing; and
a drive switching unit configured to selectively supply an output from the first drive unit and an output from the second drive unit to the synchronous rectification element.

15. An electronic apparatus, comprising:
a power supply system that comprises:
an input power supply connected to a primary side;
a load connected to a secondary side; and
a synchronous rectification circuit that comprises:
a first drive unit configured to:
detect a voltage between both sides of a synchronous rectification element, wherein the synchronous rectification element is on the secondary side;
output a first signal to turn on the synchronous rectification element based on the voltage that is lower than a first threshold voltage; and
output a second signal to turn off the synchronous rectification element based on the voltage that is higher than a second threshold voltage;
a second drive unit configured to control the voltage during a specific period, wherein
the specific period corresponds to a period during which a rectification current flows on the secondary side,
the specific period includes a start time and an end time,
the start time corresponds to a time at which the voltage reaches the second threshold voltage, and
the end time corresponds to a time at which the rectification current stops flowing; and
a drive switching unit configured to selectively supply an output from the first drive unit and an output from the second drive unit to the synchronous rectification element.

16. An electric vehicle, comprising:
a power supply system that comprises:
an input power supply connected to a primary side;
a load connected to a secondary side; and
a synchronous rectification circuit that comprises:
a first drive unit configured to:
detect a voltage between both sides of a synchronous rectification element, wherein the synchronous rectification element is on the secondary side;
output a first signal to turn on the synchronous rectification element based on the voltage that is lower than a first threshold voltage; and
output a second signal to turn off the synchronous rectification element based on the voltage that is higher than a second threshold voltage;
a second drive unit configured to control the voltage during a specific period, wherein
the specific period corresponds to a period during which a rectification current flows on the secondary side,
the specific period includes a start time and an end time,
the start time corresponds to a time at which the voltage reaches the second threshold voltage, and the end time corresponds to a time at which the rectification current stops flowing; and
a drive switching unit configured to selectively supply an output from the first drive unit and an output from the second drive unit to the synchronous rectification element;
a conversion device configured to:
receive a supply of electric power from the input power supply of the power supply system; and
convert the electric power into vehicle drive power; and
a control device configured to perform information processing that is associated with vehicle control based on information of the power supply system.

17. An electric power system, comprising:
a power information transmission/reception unit configured to transmit and receive a signal to and from a device via a network; and
a power supply system that comprises:
an input power supply connected to a primary side;
a load connected to a secondary side; and
a synchronous rectification circuit that comprises:
a first drive unit configured to:
detect a voltage between both sides of a synchronous rectification element, wherein the synchronous rectification element is on the secondary side;
output a first signal to turn on the synchronous rectification element based on the voltage that is lower than a first threshold voltage; and
output a second signal to turn off the synchronous rectification element based on the voltage that is higher than a second threshold voltage;
a second drive unit configured to control the voltage during a specific period, wherein
the specific period corresponds to a period during which a rectification current flows on the secondary side,
the specific period includes a start time and an end time,
the start time corresponds to a time at which the voltage reaches the second threshold voltage, and
the end time corresponds to a time at which the rectification current stops flowing; and
a drive switching unit configured to selectively supply an output from the first drive unit and an output from the second drive unit to the synchronous rectification element, wherein
the electric power system configured to perform charge/discharge control of electric power based on received signal, wherein the electric power is associated with the power supply system.

18. An electric power system, comprising:
a power supply system that comprises:
an input power supply connected to a primary side;
a load connected to a secondary side; and
a synchronous rectification circuit that comprises:
a first drive unit configured to:
detect a voltage between both sides of a synchronous rectification element, wherein the synchronous rectification element is on the secondary side;
output a first signal to turn on the synchronous rectification element based on the voltage that is lower than a first threshold voltage; and
output a second signal to turn off the synchronous rectification element based on the voltage that is higher than a second threshold voltage;
a second drive unit configured to control the voltage during a specific period, wherein
the specific period corresponds to a period during which a rectification current flows on the secondary side,
the specific period includes a start time and an end time,
the start time corresponds to a time at which the voltage reaches the second threshold voltage, and
the end time corresponds to a time at which the rectification current stops flowing; and
a drive switching unit configured to selectively supply an output from the first drive unit and an output from the second drive unit to the synchronous rectification element, wherein
the electric power system is configured to receive a supply of electric power from the input power supply of the power supply system, or supply electric power to a load of the power supply system, wherein the electric power is supplied from one of a power generating unit or a power network.

* * * * *